US008836427B2

(12) United States Patent
Cheng

(10) Patent No.: US 8,836,427 B2
(45) Date of Patent: Sep. 16, 2014

(54) FOLDED CASCODE OPERATIONAL AMPLIFIER

(75) Inventor: Liang Cheng, Wuxi (CN)

(73) Assignees: CSMC Technologies FAB1 Co., Ltd., Wuxi (CN); CSMC Technologies FAB2 Co., Ltd., Wuxi (CN)

( * ) Notice: Subject to any disclaimer, the term of this patent is extended or adjusted under 35 U.S.C. 154(b) by 25 days.

(21) Appl. No.: 13/807,304

(22) PCT Filed: Nov. 18, 2011

(86) PCT No.: PCT/CN2011/082428
§ 371 (c)(1),
(2), (4) Date: Dec. 28, 2012

(87) PCT Pub. No.: WO2012/068971
PCT Pub. Date: May 31, 2012

(65) Prior Publication Data
US 2013/0106512 A1    May 2, 2013

(30) Foreign Application Priority Data

Nov. 26, 2010    (CN) .......................... 2010 1 0562499

(51) Int. Cl.
*H03F 3/45*    (2006.01)
*H03F 3/30*    (2006.01)
(52) U.S. Cl.
CPC ...... *H03F 3/45192* (2013.01); *H03F 2200/458* (2013.01); *H03F 3/45183* (2013.01); *H03F 2203/45526* (2013.01); *H03F 2203/45352* (2013.01); *H03F 3/3016* (2013.01); *H03F 2203/45264* (2013.01); *H03F 2203/45248* (2013.01); *H03F 2203/45674* (2013.01); *H03F 3/45076* (2013.01)
USPC .......................................... 330/253; 330/257

(58) Field of Classification Search
CPC ........................................................ H03F 3/45
USPC .................................. 330/253, 257, 255, 261
See application file for complete search history.

(56) References Cited

U.S. PATENT DOCUMENTS

| 4,320,347 | A  | * | 3/1982 | Haque ............................... 330/9 |
| 7,755,427 | B2 | * | 7/2010 | Chen .............................. 330/261 |
| 7,978,010 | B2 | * | 7/2011 | Lee ................................. 330/255 |

* cited by examiner

*Primary Examiner* — Henry Choe
(74) *Attorney, Agent, or Firm* — Anova Law Group, PLLC

(57) ABSTRACT

A folded cascode operational amplifier is disclosed. The folded cascode operational amplifier includes a first current source, a second current source, and a first voltage terminal connected to the first current source and the second current source. The folded cascode operational amplifier also includes a first input-transistor connected to the first current source in series, and a second input-transistor connected to the second current source in series. Further, the folded cascode operational amplifier includes a tail current source connected to a connection point between the first input-transistor and the second input-transistor, a load current source, and a second voltage terminal connected to the tail current source and the load current source. The folded cascode operational amplifier also includes an output-transistor connected to the load current source, and an output-terminal arranged between the second current source and the second input-transistor and connected to the output-transistor. The second current source is a mirroring current source of the first current source, and a ratio of a current passing through the second current source to a current passing through the first current source is greater than one.

12 Claims, 6 Drawing Sheets

US 8,836,427 B2

FOLDED CASCODE OPERATIONAL AMPLIFIER

CROSS-REFERENCES TO RELATED APPLICATIONS

This application claims the priority of Chinese patent application no. 201010562499.7, filed on Nov. 26, 2010, the entire contents of which are incorporated herein by reference.

FIELD OF THE INVENTION

The present invention generally relates to the field of operational amplifiers and, more particularly, to folded cascode operational amplifier technologies.

BACKGROUND

The slew rate (SR) is a maximum ratio of output voltage of an amplifier to time, i.e., the maximum rate of change of an operational amplifier. A low slew rate is one of important factors limiting high-speed applications of the operational amplifier. Conventional folded cascode operational amplifiers usually increase the bias current value of the current source in integrated circuit (IC) to gain a high slew rate.

FIG. 1 shows a conventional folded cascode operational amplifier circuit. The current of tail current source M3 is I. When the input voltage of the circuit satisfies $V_{in+} - V_{in-} < \sqrt{2} \cdot V_{dast\_M4}$, the circuit works in a large signal state, an input-transistor M4 is conductive, a transistor M9 is turned off, and transistors M7 and M8 are turned off so that a transistor M5 is also turned off. Thus, the currents passing through M1, M3 and M4 are I. Because the width-to-length ratio and other parameters of a current source M2 are often similar to M1, the current passing through M2 is also I and it charges a load capacitor of output-terminal by transistor M6. The positive slew rate $SR_P = I/C_L$, where $C_L$ is the capacitance of the load capacitor.

On the other hand, when the input voltage of the circuit satisfies $V_{in-} - V_{in+} > \sqrt{2} \cdot V_{dast\_M4}$, the load capacitor discharges, and the negative slew rate $SR_N = I/C_L$. Such conventional folded cascode operational amplifier usually increases the bias current value of the tail current source to gain a high slew rate.

However, when gaining the high slew rate by increasing the bias current, the power consumption may also increase by multiple folds. Therefore, such method may be unable to satisfy the requirement of low power consumption in high-speed IC applications. The disclosed methods and systems are directed to solve one or more problems set forth above and other problems.

BRIEF SUMMARY OF THE DISCLOSURE

One aspect of the present disclosure includes a folded cascode operational amplifier. The folded cascode operational amplifier includes a first current source, a second current source, and a first voltage terminal connected to the first current source and the second current source. The folded cascode operational amplifier also includes a first input-transistor connected to the first current source in series, and a second input-transistor connected to the second current source in series. Further, the folded cascode operational amplifier includes a tail current source connected to a connection point between the first input-transistor and the second input-transistor, a load current source, and a second voltage terminal connected to the tail current source and the load current source. The folded cascode operational amplifier also includes an output-transistor connected to the load current source, and an output-terminal arranged between the second current source and the second input-transistor and connected to the output-transistor. The second current source is a mirroring current source of the first current source, and a ratio of a current passing through the second current source to a current passing through the first current source is greater than one.

Another aspect of the present disclosure includes a folded cascode operational amplifier. The folded cascode operational amplifier includes a first current source, a second current source, a first input-transistor connected to the first current source in series, and a second input-transistor connected to the second current source in series. The folded cascode operational amplifier also includes a tail current source connected to a connection point between the first input-transistor and the second input-transistor, and a load current source. Further, the folded cascode operational amplifier includes an output-transistor connected to the load current source, and an output-terminal arranged between the second current source and the second input-transistor and connected to the output-transistor. The folded cascode operational amplifier is configured to increase a slew rate by adjusting a width-to-length ratio of the second current source and a width-to-length ratio of the first current source.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
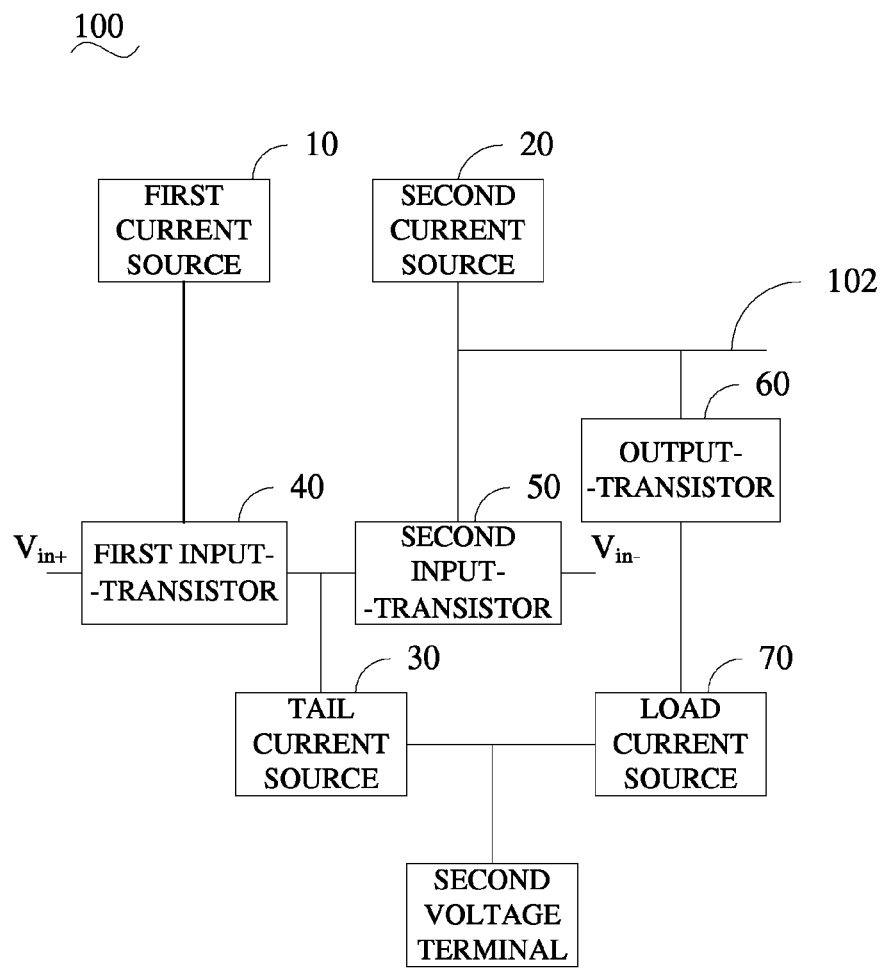
FIG. 2 illustrates an exemplary folded cascode operational amplifier consistent with the disclosed embodiments.

FIG. 2 illustrates an exemplary folded cascode operational amplifier 100 consistent with the disclosed embodiments. As shown in FIG. 2, folded cascode operational amplifier 100 includes a first current source 10, a second current source 20, a tail current source 30, a first input-transistor 40, a second input-transistor 50, an output-transistor 60, and a load current source 70. Further, the folded cascode operational amplifier 100 also includes a first voltage terminal (not shown) connected to the first current source 10 and the second current source 20, and a second voltage terminal (not numbered). Certain components may be omitted and other components may be added.

The first current source 10 is connected or coupled to the first input-transistor 40 in series; and the second current source 20 is connected to the second input-transistor 50 in series. The term "connect" or "couple", as used herein, may refer to any electrically link with or without any additional device between two connected or coupled devices. The first input-transistor 40 is connected to the second input-transistor 50 and the connection point is also coupled to the tail current source 30. Further, the tail current source 30 and the load current source 70 are both connected to the second voltage terminal, and the load current source 70 is connected to the output-transistor 60. An output-terminal 102 is arranged between the second current source 20 and the second input-transistor 50, and the output-terminal 102 is also connected to the output-transistor 60.

The first input-transistor 40 and the second input-transistor 50 are metal-oxide-semiconductor field-effect transistors (MOSFETs), and input voltages $V_{in+}$ and $V_{in-}$ are provided to the first input-transistor 40 and the second input-transistor 50, respectively. In certain embodiments, the direction of the input gate voltage $V_{in+}$ on the first input-transistor 40 is opposite to the direction of the input gate voltage $V_{in-}$ on the second input-transistor, while the absolute values of the input gate voltages $V_{in+}$ and $V_{in-}$ are equal. The first input-transistor 40 and the second input-transistor 50 compose a differential pair.

The second current source 20 may be a mirroring current source of the first current source 10, and the ratio of the current passing through the second current source 20 to the current passing through the first current source 10 may be a fixed value X, where X>1. The current passing through the output-transistor 60 and the current passing through the load current source 70 may be equal in value.

In certain embodiments, additionally or optionally, the folded cascode operational amplifier 100 may further include a first MOSFET, and the first MOSFET is connected between the first current source 10 and the first input-transistor 40 in series.

Figure 3:
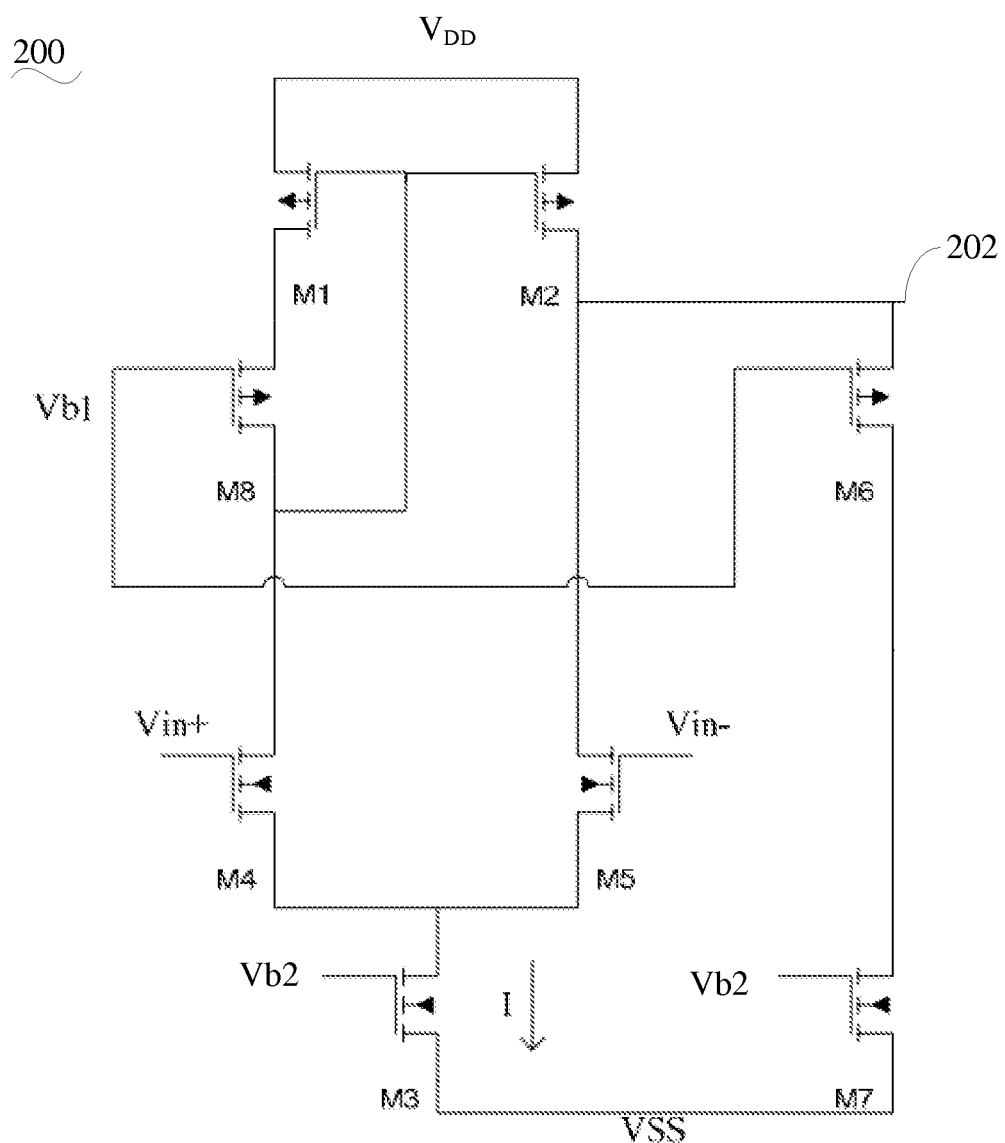
FIG. 3 illustrates an exemplary folded cascode operational amplifier consistent with the disclosed embodiments.

FIG. 3 illustrates an exemplary folded cascode operational amplifier 200 consistent with the disclosed embodiments. As shown in FIG. 3, folded cascode operational amplifier 200 includes a first current source M1, a first MOSFET M8, a second current source M2, a first input-transistor M4, a second input-transistor M5, a tail current source M3, a load current source M7, and an output-transistor M6. Certain components may be omitted and other components may be added.

The first current source M1 may be a P-type MOSFET. The source of the first current source M1 is connected to a high-voltage terminal $V_{DD}$ (referred to herein as "first voltage terminal"), the drain of the first current source M1 is connected to the first MOSFET M8, and the gate of the first current source M1 is connected to the second current source M2.

The first MOSFET M8 may be a P-type MOSFET. The source of the first MOSFET M8 is connected to the drain of the first current source M1, the drain of the first MOSFET M8 is connected to the gate of the first current source M1, and the gate of the first MOSFET M8 is connected to the output-transistor M6.

The second current source M2 may also be a P-type MOSFET. The source of the second current source M2 is connected to the high-voltage terminal $V_{DD}$; the gate of the second current source M2 is connected to the gate of the first current M1 and the drain of the first MOSFET M8; and the drain of the second current source M2 is connected to the drain of the second input transistor M5 and also to the output terminal 202.

The first input-transistor M4 and the second input-transistor M5 may be the same N-type MOSFETs. The gate of the first input-transistor M4 is an input-terminal of a positive input voltage $V_{in+}$ of the differential pair, and the gate of the second input-transistor M5 is an input-terminal of a negative voltage $V_{in-}$ of the differential pair. Further, the source of the first input-transistor M4 and the source of the second input-transistor M5 are connected together; the drain of the first input-transistor M4 is connected to the drain of the first MOSFET M8; and the drain of the second input-transistor M5 is connected to the output-transistor M6.

The tail current source M3 may be an N-type MOSFET. The drain of the tail current source M3 is connected to both the source of the first input-transistor M4 and the source of the second input-transistor M5, and the source of the tail current source M3 is connected to load current source M7.

The load current source M7 may be an N-type MOSFET. The source of the load current source M7 is connected to the source of the tail current source M3 and a low-voltage terminal $V_{SS}$ (referred to herein as "second voltage terminal") of the amplifier circuit 200, and the drain of the load current source M7 is connected to the output-transistor M6.

The output-transistor M6 may be a P-type MOSFET. The gate of the output-transistor M6 is connected to the gate of the first MOSFET M8, the source of the output-transistor M6 is connected to the drain of the second current source M2 and the drain of the second input-transistor M5, and the drain of the output-transistor M6 is connected to the load current source M7. The gate voltage of the output-transistor M6 and the first MOSFET M8 is $V_{b1}$, and the gate voltage of the tail current source M3 and the load current source M7 is $V_{b2}$.

Further, the first MOSFET M8 and the output-transistor M6 may form a symmetrical circuit structure. The source voltages of the first MOSFET M8 and the output-transistor M6 are approximately equal, and the gate voltages of the first MOSFET M8 and the output-transistor M6 are equal. However, the width-to-length ratios of the first MOSFET M8 and the output-transistor M6 can be different.

Because the gate of the first current source M1 is connected to the drain of the first MOSFET M8, instead of directly connected to the drain of the first current source M1 itself or other configurations, the first current source M1 can gain a lower gate voltage. Thus, the size of the first current source M1 can be made smaller. Further, the symmetrical circuit structure makes the drain voltage of the first current source M1 approximately equal to that of the second current source M2, so that the accuracy of the second current source M2 mirroring the first current source M1 can be achieved.

In certain embodiments, the width-to-length ratio (W/L) of the second current source M2 may be three times as that of the first current source M1. The current value of the tail current source M3 of the differential pair is I, and the current value of the load current source M7 is made to be I.

Further, when the input voltage satisfies the condition of $V_{in+} - V_{in-} > \sqrt{2} \cdot V_{dast\_M4}$ (where Vdast_M4 is an overdrive voltage of the first input-transistor M4), the first input-transistor M4 is conductive, and the second input-transistor M5 is turned off. The amplifier circuit 200 works in a large signal state, and the entire current of the tail current source M3 of the differential pair passes through the first input-transistor M4 then the first MOSFET M8 and the first current source M1. Thus, the current passing through the first current source M1 is I, and the current passing through the second current source M2 is 3I. Further, because the current passing through the load current source M7 is I, the current passing through output-transistor M6 is also I. Therefore, the output current of the output-terminal 202 is $I_{out}=3I-I=2I$, and the positive slew rate $SR_{P1}=2I/C_L$, where $C_L$ is the capacitance value of a load capacitor.

When the input voltage satisfies the condition of $V_{in-}-V_{in+}>\sqrt{2}\cdot V_{dast\_M4}$, the second input-transistor M5 is conductive, and the first input-transistor M4 is turned off. The amplifier circuit 200 works in a large signal state, and the entire current of the tail current source M3 of the differential pair passes through the second input-transistor M5. Because the first input-transistor M4 is turned off, the first current source M1 and the second current source M2 are also turned off. Further, because the current passing through the load current source M7 is I, the current passing through the output-transistor M6 is I, and the discharge current of the load capacitor discharged by the output-terminal 202 is $I_{discharge}=I+I=2I$. Thus, the negative slew rate $SR_{N1}=2I/C_L$.

Figure 1:
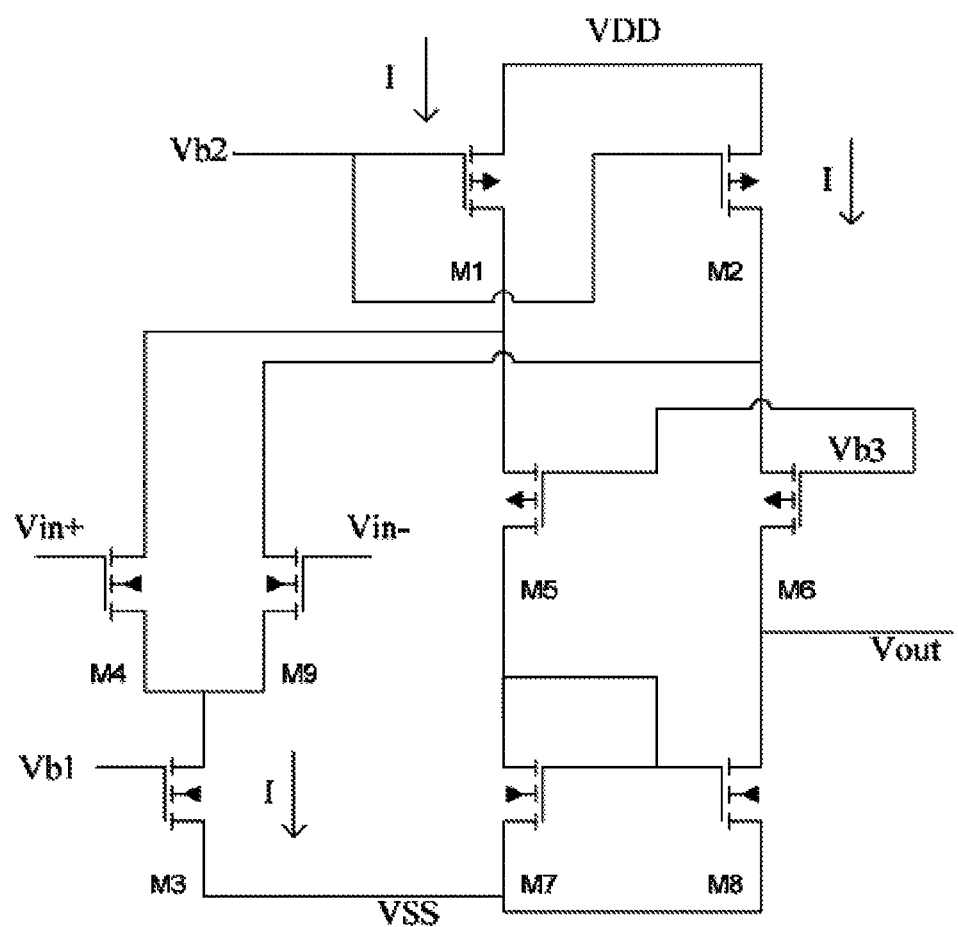
FIG. 1 is a circuit diagram of a conventional folded cascode operational amplifier.

Therefore, compared with conventional folded cascode operational amplifier showed in FIG. 1, provided the bias current I in the tail current source being equal, the slew rate of the folded cascode operational amplifier 200 as shown in FIG. 3 is twice the slew rate of the conventional folded cascode operational amplifier. Moreover, the folded cascode operational amplifier 200 gains the higher slew rate without adding circuit complexity or power consumption under the same bias current.

Figure 4:
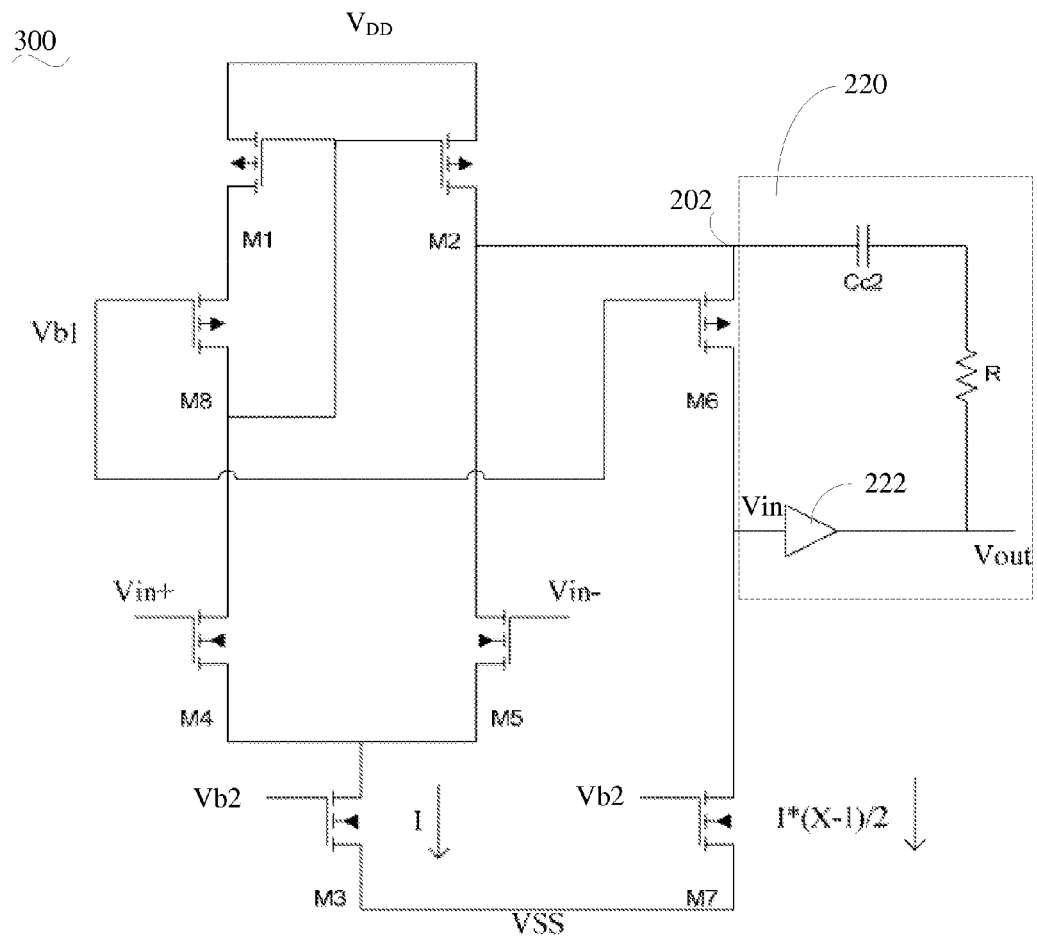
FIG. 4 illustrates another exemplary folded cascode operational amplifier consistent with the disclosed embodiments.

FIG. 4 illustrates an exemplary folded cascode operational amplifier 300 consistent with the disclosed embodiments. The folded cascode operational amplifier 300 is similar to the folded cascode operational amplifier 200 shown in FIG. 3. However, as shown in FIG. 4, the folded cascode operational amplifier 300 further includes a buffering output module 220.

The buffering output module 220 includes a Miller capacitor $C_C2$, a resistor R and a buffer unit 222. Other type of capacitor may also be used. One terminal of the Miller capacitor $C_C2$ is connected to both the source of the output-transistor M6 and output-terminal 202; and the other terminal of the Miller capacitor $C_C2$ is connected to the resistor R. Further, an input terminal ($V_{in}$ terminal) of the buffer unit 222 is connected to both the drain of the output-transistor M6 and the drain of the load current source M7, and an output terminal ($V_{out}$ terminal) of the buffer unit 222 is connected to the resistor R. By setting desired parameters for the Miller capacitor $C_C2$ and the resistor R, the poles of the input stage and the buffering output stage of the folded cascode operational amplifier 300 can be adjusted to improve the stability of the folded cascode operational amplifier 300.

Figure 5:
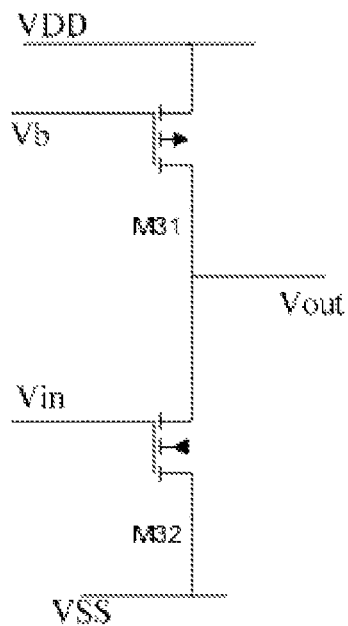
FIG. 5 illustrates a circuit diagram of a buffer unit using a common-source amplifier structure consistent with the disclosed embodiments.

The buffer unit 222 may be implemented in any appropriate different circuit structure, such as a common-source amplifier structure, a push-pull output structure, and a source follower push-pull output structure. FIG. 5 illustrates a circuit diagram of a buffer unit 222 using a common-source amplifier structure consistent with the disclosed embodiments. As shown in FIG. 5, the buffer unit 222 includes a P-type MOSFET M31 and an N-type MOSFET M32. The source of the PMOS M31 is connected to the terminal $V_{DD}$, the drain of the PMOS M31 is connected to both the drain of the NMOS M32 and the terminal $V_{out}$. The gate of the NMOS M32 is the terminal $V_{in}$, and the source of the NMOS M32 is connected to the terminal $V_{SS}$.

Figure 6:
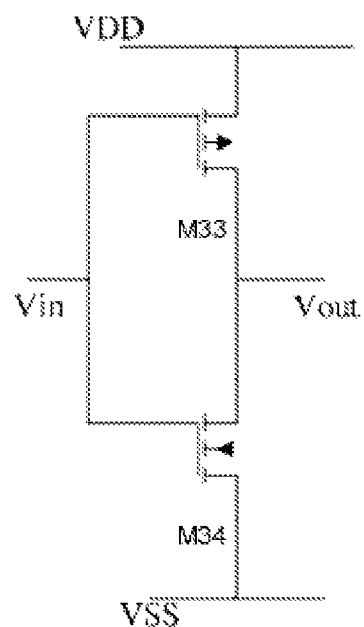
FIG. 6 illustrates a circuit diagram of a buffer unit using a push-pull output structure consistent with the disclosed embodiments.

FIG. 6 illustrates a circuit diagram of a buffer unit 222 using a push-pull output structure consistent with the disclosed embodiments. As shown in FIG. 6, the buffer unit 222 includes a P-type MOSFET M33 and an N-type MOSFET M34, the gate of the P-type MOSFET M33 and the gate of the N-type MOSFET M34 are connected together and also to the terminal $V_{in}$, and the drain of the P-type MOSFET M33 and the drain of the N-type MOSFET M34 are connected together and also to the terminal $V_{out}$. Further, the source of the PMOS M33 is connected to the terminal $V_{DD}$, and the source of the NMOS M34 is connected to the terminal $V_{SS}$.

Figure 7:
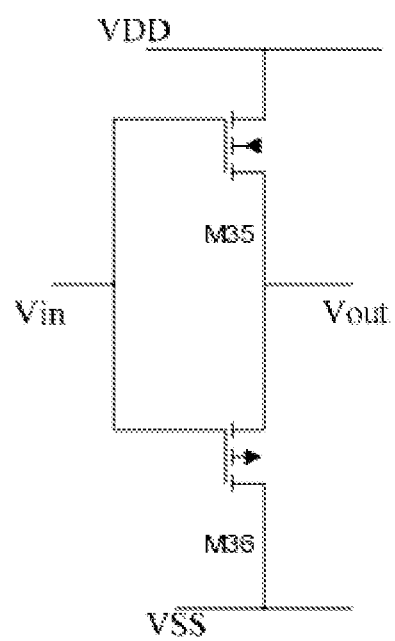
FIG. 7 illustrates a circuit diagram of a buffer unit using a source follower push-pull output structure consistent with the disclosed embodiments.

FIG. 7 illustrates a circuit diagram of a buffer unit 222 using a source follower push-pull output structure consistent with the disclosed embodiments. As shown in FIG. 7, the buffer unit 222 includes an N-type MOSFET M35 and a P-type MOSFET M36. The gate of the N-type MOSFET M35 and the gate of the P-type MOSFET M36 are connected together and also to the terminal $V_{in}$, and the source of the N-type MOSFET M35 and the source of the P-type MOSFET M36 are connected together and also to the terminal $V_{out}$. Further, the drain of the NMOS M35 is connected to the terminal $V_{DD}$, and the drain of the PMOS M36 is connected to the terminal $V_{SS}$. Other circuit structures may also be used.

In addition, returning to FIG. 4, the slew rate of the folded cascode operational amplifier 300 may be increased by adjusting the width-to-length ratios of the second current source M2 and the first current source M1 and adjusting the bias current of the load current source M7 at the same time. For example, while the width-to-length ratio of the second current source M2 is adjusted to X times of the width-to-length ratio of the first current source M1, device parameters are also adjusted to make the bias current passing through the load current source M7 to $(X-1)I/2$.

When the input voltage satisfies the condition $V_{in+}-V_{in-}>rl\sqrt{2rlx}\cdot V_{dast\_M4}$, the first input-transistor M4 is conductive, the second input-transistor M5 is turned off, and the circuit works in a large signal state. The entire current of the tail current source M3 of the differential pair passes through the first input-transistor M4, and then through the first MOSFET M8 and the first current source M1. Thus, the current passing through the first current source M1 is I, and the current passing through the second current source M2 is X*I. Further, because the current passing through the load current source M7 is $(X-1)I/2$, the current passing through the output-transistor M6 is also $(X-1)I/2$. The charge current to the Miller capacitor CC2 is then represented by $X*I-(X-1)*I/2=(X+1)*I/2$. Thus, the positive slew rate is $SR_{P2}=(X+1)I/2C_C2$, where $C_C2$ is the capacitance of the Miller capacitor $C_C2$.

When the input voltage satisfies the condition $V_{in-}-V_{in+}>\sqrt{2}\cdot V_{dast\_M4}$, the second input-transistor M5 is conductive, the first input-transistor M4 is turned off, and the circuit works in a large signal state. The entire current of the tail current source M3 of the differential pair passes through the second input-transistor M5. Because the first input-transistor M4 is turned off, the first current source M1 and the second current source M2 are also turned off. Further, because the current passing through the load current source M7 is $(X-1)I/2$, the current passing through the output-transistor M6 is $(X-1)I/2$, and the discharge current of the Miller capacitor $C_C2$ is: $I+(X-1)*I/2=(X+1)*I/2$. Thus, the negative slew rate $SR_{N2}=(X+1)I/2C_C2$.

That is, even though the bias current of input-transistor is unchanged (i.e., the bias current of the tail current source M3 remains the same), the slew rate of folded cascode operational amplifier 300 can be increased by adjusting the width-to-length ratios of both the second current source M2 and the first current source M1 (e.g., the relative ratio between the width-to-length ratios) and adjusting the bias current of load current source M7. The conventional folded cascode operational amplifier may be unable to realize such slew rate increases. In other words, in the conventional folded cascode operational amplifier, the slew rate would not change if only changing the bias current of the load current source while the bias current of the input-transistor is not changed.

It is understood that, although an N-type MOSFET is used as the input-transistor for illustrative purposes, other type of transistor, such as a P-type MOSFET, may be used in the disclosed folded cascode operational amplifier as the input-transistor.

By using the disclosed systems and methods, even in the condition of not increasing the bias current of the tail current source (i.e. the bias current of input-transistor is unchanged), the slew rate can be enhanced only by adjusting the width-to-length ratios of both the second current source and the first current source, and by adjusting the bias current of load current source at the same time. This may overcome the problems that such slew rate increases cannot be realized by the conventional folded cascode operational amplifiers, in which the slew rate would not change if only changing the bias current of the load current source while the bias current of the input-transistor is not changed.

It is understood that the disclosed embodiments may be applied to any operational amplifiers. Various alternations, modifications, or equivalents to the technical solutions of the disclosed embodiments can be obvious to those skilled in the art.

What is claimed is:

1. A folded cascode operational amplifier, comprising:
    a first current source;
    a second current source;
    a first voltage terminal connected to the first current source and the second current source;
    a first input-transistor connected to the first current source in series;
    a first metal-oxide-semiconductor field-effect transistor (MOSFET) connected in series between the first current source and the first input-transistor;
    a second input-transistor connected to the second current source in series;
    a tail current source connected to a connection point between the first input-transistor and the second input-transistor;
    a load current source;
    a second voltage terminal connected to the tail current source and the load current source;
    an output-transistor connected to the load current source; and
    an output-terminal arranged between the second current source and the second input-transistor and connected to the output-transistor,
    wherein the second current source is a mirroring current source of the first current source, and a ratio of a current passing through the second current source to a current passing through the first current source is greater than one.

2. The folded cascode operational amplifier according to claim 1, wherein:
    the output-transistor is a P-type MOSFET;
    the source of the output-transistor is connected to the output-terminal; the drain of the output-transistor is connected to the load current source;
    the drain of the first MOSFET is connected to the first input-transistor; the gate of the first MOSFET is connected to the output-transistor; the first MOSFET and the output-transistor form a symmetrical circuit structure; and
    a gate voltage of the first MOSFET is equal to a gate voltage of the output-transistor.

3. The folded cascode operational amplifier according to claim 1, wherein:
    the first input-transistor and the second input-transistor are MOSFETs;
    a gate voltage of the first input-transistor and a gate voltage of the second input-transistor have opposite directions but equal absolute values; and
    the first input-transistor and the second input-transistor compose a differential pair.

4. The folded cascode operational amplifier according to claim 2, wherein:
    the first current source and the second current source are P-type MOSFETs;
    both the source of the first current source and the source the second current source are connected to the first voltage terminal; and
    the gate of the first current source is connected to the gate of the second current source and also between the first MOSFET and the first input-transistor.

5. The folded cascode operational amplifier according to claim 1, further including:
    a buffer module connected to the output-terminal, wherein:
    the buffer module includes a Miller capacitor, a resistor and a buffer unit;
    one terminal of the Miller capacitor is connected to the output-terminal;
    the other terminal of the Miller capacitor is connected to the resistor;
    a $V_{in}$ terminal of the buffer unit is connected between the output-transistor and the load current source; and
    a $V_{out}$ terminal of the buffer unit is connected to the resistor.

6. The folded cascode operational amplifier according to claim 5, wherein:
    the buffer unit is one of a common-source amplifier structure, a push-pull output structure, and a source follower push-pull output structure.

7. The folded cascode operational amplifier according to claim 1, wherein:
    the tail current source is an N-type MOSFET;
    the drain of the tail current source is connected to both the first input-transistor and the second input-transistor; and
    the source of the tail current source is connected to the load current source.

8. The folded cascode operational amplifier according to claim 1, wherein:
    the load current source is an N-type MOSFET;
    the source of the load current source is connected to both the tail current source and the second voltage terminal; and
    the drain of the load current source is connected to the output-transistor.

9. The folded cascode operational amplifier according to claim 1, wherein:
    the first input-transistor and the second input-transistor are N-type MOSFETs;
    the source of the first input-transistor and the source of the second input-transistor are connected together;
    the drain of the first input-transistor is connected to the first MOSFET; and
    the drain of the second input-transistor is connected to the output-terminal, the second current source, and the output-transistor.

10. A folded cascode operational amplifier, comprising:
    a first current source;
    a second current source;
    a first input-transistor connected to the first current source in series;

a first metal-oxide-semiconductor field-effect transistor (MOSFET) connected in series between the first current source and the first input-transistor such that size of the first current source can be reduced;

a second input-transistor connected to the second current source in series;

a tail current source connected to a connection point between the first input-transistor and the second input-transistor;

a load current source;

an output-transistor connected to the load current source; and an output-terminal arranged between the second current source and the second input-transistor and connected to the output-transistor, wherein the folded cascode operational amplifier is configured to increase a slew rate by adjusting a width-to-length ratio of the second current source and a width-to-length ratio of the first current source.

11. The folded cascode operational amplifier according to claim 10, wherein:

the slew rate is increased without changing a current I passing through the tail current source.

12. The folded cascode operational amplifier according to claim 11, wherein:

the width-to-length ratio of the second current source and the width-to-length ratio of the first current source are adjusted such that the width-to-length ratio of the second current source is X times of the width-to-length ratio of the first current source;

a bias current passing through the load current source is also adjusted to $(X-1)I/2$; and the slew rate is increased to $(X+1)I/2C$, wherein X is greater than 1, and C is capacitance of a corresponding load capacitor.

* * * * *